United States Patent
Kang et al.

(10) Patent No.: US 10,366,865 B2
(45) Date of Patent: *Jul. 30, 2019

(54) GAS DISTRIBUTION SYSTEM FOR CERAMIC SHOWERHEAD OF PLASMA ETCH REACTOR

(71) Applicant: LAM RESEARCH CORPORATION, Fremont, CA (US)

(72) Inventors: Michael Kang, San Ramon, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 674 days.

This patent is subject to a terminal disclaimer.

(21) Appl. No.: 15/005,877

(22) Filed: Jan. 25, 2016

(65) Prior Publication Data
US 2016/0217977 A1    Jul. 28, 2016

Related U.S. Application Data

(63) Continuation of application No. 13/118,933, filed on May 31, 2011, now Pat. No. 9,245,717.

(51) Int. Cl.
*B01F 15/02* (2006.01)
*C23C 16/455* (2006.01)
(Continued)

(52) U.S. Cl.
CPC ...... *H01J 37/3244* (2013.01); *B01F 15/0264* (2013.01); *C23C 16/4558* (2013.01);
(Continued)

(58) Field of Classification Search
CPC .... B01D 15/14; B01F 15/0264; B01F 5/0601; B01J 19/02; B01J 19/26;
(Continued)

(56) References Cited

U.S. PATENT DOCUMENTS

| 2,603,382 A | 7/1952 | Kojan |
| 3,866,625 A * | 2/1975 | Kemner ............... F15B 13/0814 |
| | | 137/269 |

(Continued)

FOREIGN PATENT DOCUMENTS

| JP | 2003-059900 A | 2/2003 |
| JP | 2003059900 A * | 2/2003 ............... H01J 37/16 |

(Continued)

OTHER PUBLICATIONS

International Search Report (Forms PCT/ISA/220 and PCT/ISA/210) dated Jul. 19, 2012, by the International Search Authority in corresponding International Application No. PCT/US2012/038085 (8 pages).

(Continued)

*Primary Examiner* — Jeffrie R Lund
*Assistant Examiner* — Stanislav Antolin

(57) ABSTRACT

A gas delivery system for a ceramic showerhead includes gas connection blocks and a gas ring, the gas connection blocks mounted on the gas ring such that gas outlets in the blocks deliver process gas to gas inlets in an outer periphery of the showerhead. The gas ring includes a bottom ring with channels therein and a welded cover plate enclosing the channels. The gas ring can include a first channel extending ½ the length of the gas ring, two second channels connected at midpoints thereof to downstream ends of the first channel, and four third channels connected at midpoints thereof to downstream ends of the second channels. the cover plate can include a first section enclosing the first channel, two second sections connected at midpoints thereof to ends of the first section, and third sections connected at midpoints thereof to ends of the second sections. The channels are arranged such that the process gas travels equal distances for a single gas (Continued)

inlet in the gas ring to eight outlets in the cover ring allowing equal gas flow.

8 Claims, 17 Drawing Sheets

(51) Int. Cl.
  *H01J 37/32* (2006.01)
  *H01L 21/67* (2006.01)
  *H01L 21/3065* (2006.01)
  *H01L 21/311* (2006.01)

(52) U.S. Cl.
  CPC .. *C23C 16/45561* (2013.01); *C23C 16/45563* (2013.01); *H01J 37/321* (2013.01); *H01J 37/3211* (2013.01); *H01J 37/32642* (2013.01); *H01L 21/67069* (2013.01); *H01J 2237/006* (2013.01); *H01J 2237/334* (2013.01); *H01L 21/30655* (2013.01); *H01L 21/31116* (2013.01); *Y10T 137/0402* (2015.04); *Y10T 137/85938* (2015.04)

(58) Field of Classification Search
  CPC .............. B01J 2219/00761–00765; B01J 2219/00783–00833; B01J 2219/00804–00817; B01J 2219/00903; B01J 2219/02–0295; B01J 2219/1941; B01J 2219/194–1948; B05B 1/185; C23C 16/0227; C23C 16/45563–4558; C23C 16/45565; C23C 16/455–4551; C23C 16/45561; C30B 25/14; C30B 31/16; C30B 25/165; F16L 41/001; F16L 41/02; F16L 41/021; F16L 41/023; H01J 2237/006; H01J 2237/3323; H01J 2237/334; H01J 37/321; H01J 37/3244–32449; H01J 37/32458; H01J 37/32467; H01J 37/32513; H01L 21/02274; H01L 21/30655; H01L 21/31116; H01L 21/67069; Y10T 137/0402; Y10T 137/85938; Y10T 137/877; Y10T 137/87877; Y10T 24/2189
  See application file for complete search history.

(56) References Cited

U.S. PATENT DOCUMENTS

| | | | |
|---|---|---|---|
| 5,501,893 A | 3/1996 | Laermer et al. | |
| 5,597,439 A | 1/1997 | Salzman | |
| 5,622,606 A | 4/1997 | Kugler et al. | |
| 5,680,013 A | 10/1997 | Dornfest et al. | |
| 5,836,355 A * | 11/1998 | Markulec | F16K 27/003 137/884 |
| 5,895,530 A | 4/1999 | Shrotriya et al. | |
| 5,959,409 A | 9/1999 | Dornfest et al. | |
| 5,968,276 A | 10/1999 | Lei et al. | |
| 5,971,190 A | 10/1999 | Mannino | |
| 5,996,528 A | 12/1999 | Berrian et al. | |
| 6,013,155 A | 1/2000 | McMillin et al. | |
| 6,059,885 A | 5/2000 | Ohashi et al. | |
| 6,106,625 A | 8/2000 | Koai et al. | |
| 6,110,556 A | 8/2000 | Bang et al. | |
| 6,129,808 A | 10/2000 | Wicker et al. | |
| 6,245,192 B1 | 6/2001 | Dhindsa et al. | |
| 6,270,862 B1 | 8/2001 | McMillin et al. | |
| 6,394,026 B1 | 5/2002 | Wicker et al. | |
| 6,415,736 B1 | 7/2002 | Hao et al. | |
| 6,417,626 B1 | 7/2002 | Brcka et al. | |
| 6,432,831 B2 | 8/2002 | Dhindsa et al. | |
| 6,440,221 B2 | 8/2002 | Shamouilian et al. | |
| 6,583,064 B2 | 6/2003 | Wicker et al. | |
| 6,616,327 B1 | 9/2003 | Kearney et al. | |
| 6,635,117 B1 | 10/2003 | Kinnard et al. | |
| 6,761,796 B2 | 7/2004 | Srivastava et al. | |
| 6,872,258 B2 | 3/2005 | Park et al. | |
| 6,998,014 B2 | 2/2006 | Chen et al. | |
| 7,070,833 B2 | 7/2006 | Smith et al. | |
| 7,213,618 B2 * | 5/2007 | Milburn | F16K 27/003 137/884 |
| 7,390,408 B2 | 6/2008 | Kearney et al. | |
| 7,396,480 B2 | 7/2008 | Kao et al. | |
| 7,459,100 B2 | 12/2008 | Kiermasz et al. | |
| 7,520,957 B2 | 4/2009 | Kao et al. | |
| 7,655,092 B2 | 2/2010 | Fairbairn et al. | |
| 7,667,840 B2 | 2/2010 | Otsuki et al. | |
| 7,708,859 B2 | 5/2010 | Huang et al. | |
| 7,722,737 B2 | 5/2010 | Gondhalekar et al. | |
| 7,754,013 B2 | 7/2010 | Granneman | |
| 7,771,562 B2 | 8/2010 | Brcka | |
| 7,785,417 B2 | 8/2010 | Ni et al. | |
| 7,842,617 B2 | 11/2010 | Nishizuka | |
| 7,931,945 B2 | 4/2011 | Otsuki et al. | |
| 7,955,986 B2 | 6/2011 | Hoffman et al. | |
| 7,976,671 B2 | 7/2011 | Chandrachood et al. | |
| RE42,882 E | 11/2011 | Kearney | |
| 8,088,248 B2 | 1/2012 | Larson | |
| 8,191,505 B2 | 6/2012 | Kamaishi et al. | |
| 8,291,935 B1 * | 10/2012 | Merritt | F16K 27/003 137/597 |
| 8,343,307 B2 | 1/2013 | Huston | |
| 8,440,049 B2 | 5/2013 | Zhou et al. | |
| 8,475,625 B2 | 7/2013 | Pamarthy et al. | |
| 8,522,716 B2 | 9/2013 | Kadkhodayan et al. | |
| 8,562,785 B2 * | 10/2013 | Kang | H01J 37/3244 156/345.48 |
| 8,573,152 B2 | 11/2013 | de la Llera et al. | |
| 8,758,511 B2 | 6/2014 | Iizuka et al. | |
| 8,796,153 B2 | 8/2014 | Patrick et al. | |
| 9,032,906 B2 | 5/2015 | Ma et al. | |
| 9,034,142 B2 | 5/2015 | Bartlett et al. | |
| 9,099,398 B2 * | 8/2015 | Kang | H01J 37/3244 |
| 9,245,717 B2 * | 1/2016 | Kang | H01J 37/321 |
| 9,394,615 B2 | 7/2016 | Sun et al. | |
| 9,466,468 B2 | 10/2016 | Okayama et al. | |
| 9,934,979 B2 * | 4/2018 | Kang | H01J 37/3244 |
| 2002/0000198 A1 | 1/2002 | Ishikawa et al. | |
| 2003/0070620 A1 | 4/2003 | Cooperberg et al. | |
| 2003/0143328 A1 | 7/2003 | Chen et al. | |
| 2003/0209324 A1 | 11/2003 | Fink | |
| 2004/0058070 A1 | 3/2004 | Takeuchi et al. | |
| 2004/0099378 A1 * | 5/2004 | Kim | C23C 16/4558 156/345.33 |
| 2004/0129211 A1 | 7/2004 | Blonigan et al. | |
| 2004/0142558 A1 * | 7/2004 | Granneman | C23C 16/4411 438/680 |
| 2004/0187779 A1 * | 9/2004 | Park | C23C 16/4404 118/715 |
| 2004/0238123 A1 | 12/2004 | Becknell et al. | |
| 2005/0087302 A1 | 4/2005 | Mardian et al. | |
| 2005/0103275 A1 | 5/2005 | Sasaki et al. | |
| 2005/0109279 A1 * | 5/2005 | Suzuki | C23C 16/45508 118/723 MW |
| 2005/0183826 A1 | 8/2005 | Choi et al. | |
| 2005/0223986 A1 | 10/2005 | Choi et al. | |
| 2005/0224121 A1 * | 10/2005 | Milburn | F16K 27/003 137/884 |
| 2005/0230350 A1 | 10/2005 | Kao et al. | |
| 2005/0241766 A1 * | 11/2005 | Dhindsa | H01J 37/32009 156/345.34 |
| 2005/0255257 A1 | 11/2005 | Choi et al. | |
| 2006/0060141 A1 | 3/2006 | Kamaishi et al. | |
| 2006/0113038 A1 * | 6/2006 | Gondhalekar | C23C 16/4558 156/345.33 |
| 2006/0162661 A1 | 7/2006 | Jung et al. | |
| 2006/0180275 A1 | 8/2006 | Steger | |
| 2006/0228496 A1 | 10/2006 | Choi et al. | |
| 2007/0066038 A1 | 3/2007 | Sadjadi et al. | |
| 2007/0113981 A1 | 5/2007 | Brcka | |
| 2007/0119370 A1 | 5/2007 | Ma et al. | |

(56) References Cited

U.S. PATENT DOCUMENTS

| | | |
|---|---|---|
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2007/0158025 A1 | 7/2007 | Larson |
| 2007/0227659 A1 | 10/2007 | Iizuka |
| 2007/0256786 A1* | 11/2007 | Zhou ................. H01J 37/32477 156/345.34 |
| 2007/0264444 A1 | 11/2007 | Otsuki et al. |
| 2007/0266944 A1* | 11/2007 | Iizuka ................. C23C 16/4402 118/722 |
| 2008/0102202 A1* | 5/2008 | Chandrachood .. H01J 37/32082 427/248.1 |
| 2008/0105202 A9 | 5/2008 | Fairbaim et al. |
| 2008/0178805 A1* | 7/2008 | Paterson ........... H01J 37/32091 |
| 2008/0178906 A1 | 7/2008 | Egley et al. |
| 2008/0193673 A1* | 8/2008 | Paterson ........... H01J 37/32091 427/569 |
| 2008/0236490 A1 | 10/2008 | Paterson et al. |
| 2008/0264338 A1 | 10/2008 | Otsuki et al. |
| 2008/0268171 A1 | 10/2008 | Ma et al. |
| 2009/0042321 A1* | 2/2009 | Sasaki ............... H01J 37/32449 438/10 |
| 2009/0137125 A1 | 5/2009 | Nozawa et al. |
| 2009/0159213 A1 | 6/2009 | Bera et al. |
| 2009/0159566 A1 | 6/2009 | Brillhart et al. |
| 2009/0162260 A1 | 6/2009 | Bera et al. |
| 2009/0162262 A1* | 6/2009 | Bera .................. H01J 37/3244 422/186.04 |
| 2009/0194233 A1* | 8/2009 | Tamura ............... C23C 16/4404 156/345.1 |
| 2009/0200269 A1 | 8/2009 | Kadkhodayan et al. |
| 2009/0218045 A1 | 9/2009 | Hiroshima et al. |
| 2009/0221149 A1* | 9/2009 | Hammond, IV .... H01J 37/3244 438/706 |
| 2009/0260762 A1 | 10/2009 | Kamaishi et al. |
| 2009/0272492 A1 | 11/2009 | Katz et al. |
| 2009/0275206 A1* | 11/2009 | Katz .................. H01J 37/3244 438/714 |
| 2009/0311869 A1* | 12/2009 | Okesaku ........... C23C 16/45565 438/710 |
| 2009/0311872 A1* | 12/2009 | Ueda .................. C23C 16/4558 438/726 |
| 2010/0089870 A1 | 4/2010 | Hiroshima et al. |
| 2010/0261354 A1* | 10/2010 | Bettencourt ............ H01J 37/16 438/710 |
| 2010/0288439 A1* | 11/2010 | Ishibashi ........... C23C 16/45565 156/345.33 |
| 2011/0056626 A1* | 3/2011 | Brown .................. H01J 37/321 156/345.33 |
| 2011/0070740 A1 | 3/2011 | Bettencourt et al. |
| 2011/0083809 A1 | 4/2011 | de la Llera et al. |
| 2011/0146571 A1 | 6/2011 | Bartlett et al. |
| 2011/0162800 A1* | 7/2011 | Noorbakhsh ..... C23C 16/45565 156/345.34 |
| 2011/0206833 A1 | 8/2011 | Sexton et al. |
| 2011/0220023 A1* | 9/2011 | Lee ....................... F16L 23/006 118/715 |
| 2011/0291568 A1* | 12/2011 | Iizuka .................. H01J 37/321 315/111.51 |
| 2012/0199071 A1 | 8/2012 | Collins et al. |
| 2012/0305190 A1 | 12/2012 | Kang et al. |
| 2012/0309204 A1 | 12/2012 | Kang et al. |
| 2013/0034967 A1* | 2/2013 | Bettencourt ............ H01J 37/16 438/710 |
| 2013/0284373 A1 | 10/2013 | Sun et al. |
| 2014/0065827 A1 | 3/2014 | Kang et al. |
| 2014/0183049 A1 | 7/2014 | Mayer et al. |
| 2015/0107772 A1 | 4/2015 | Uchida |
| 2015/0279621 A1 | 10/2015 | Brown et al. |
| 2015/0348755 A1 | 12/2015 | Han et al. |
| 2016/0005572 A1 | 1/2016 | Liang et al. |

FOREIGN PATENT DOCUMENTS

| | | | |
|---|---|---|---|
| JP | 4608827 B2 * | 1/2011 | ............ H01J 37/16 |
| TW | M396482 U * | 1/2011 | ............ H01J 37/16 |
| WO | WO-2008123391 A2 * | 10/2008 | ........ H01J 37/32449 |
| WO | 2009031413 A1 | 3/2009 | |
| WO | WO-2009031413 A1 * | 3/2009 | ....... C23C 16/45565 |
| WO | WO-2011019157 A2 * | 2/2011 | ............ F16L 23/006 |
| WO | WO-2011068730 A2 * | 6/2011 | ............ F16L 23/006 |

OTHER PUBLICATIONS

C. Otto Gehrckens GmbH & Co. KG. "O-ring basics", 2007, 32 pages.

U.S. Appl. No. 61/266,820, Norbakhsh, et al. "Reconfigurable Multi-zone gas delivery hardware for substrate processing showerheads", filed Dec. 4, 2009, 32 pages.

Translation of the Notification of Examination Opinions dated Jan. 6, 2017 corresponding to Taiwanese Patent Application No. 105129730, 3 pages.

Korean Office Action dated Jul. 11, 2018 corresponding to Korean Patent Application No. 2013-7035182, 7 pages.

\* cited by examiner

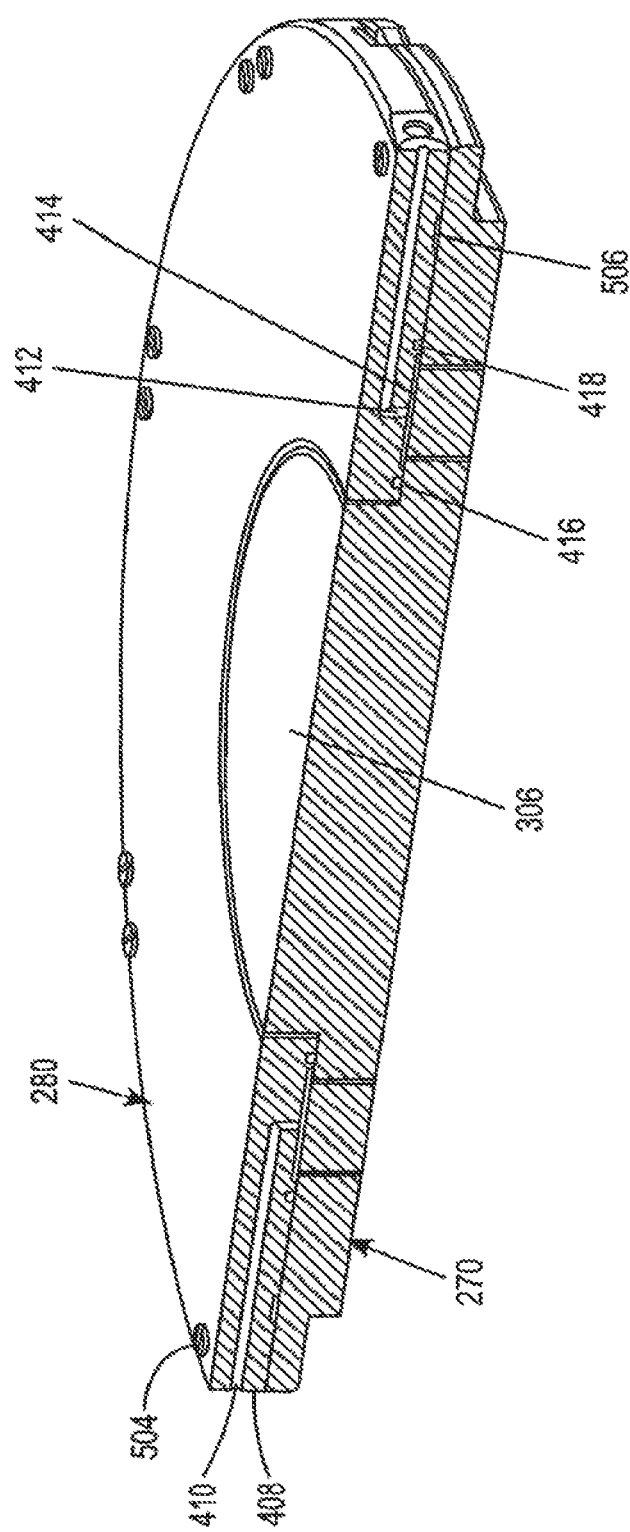

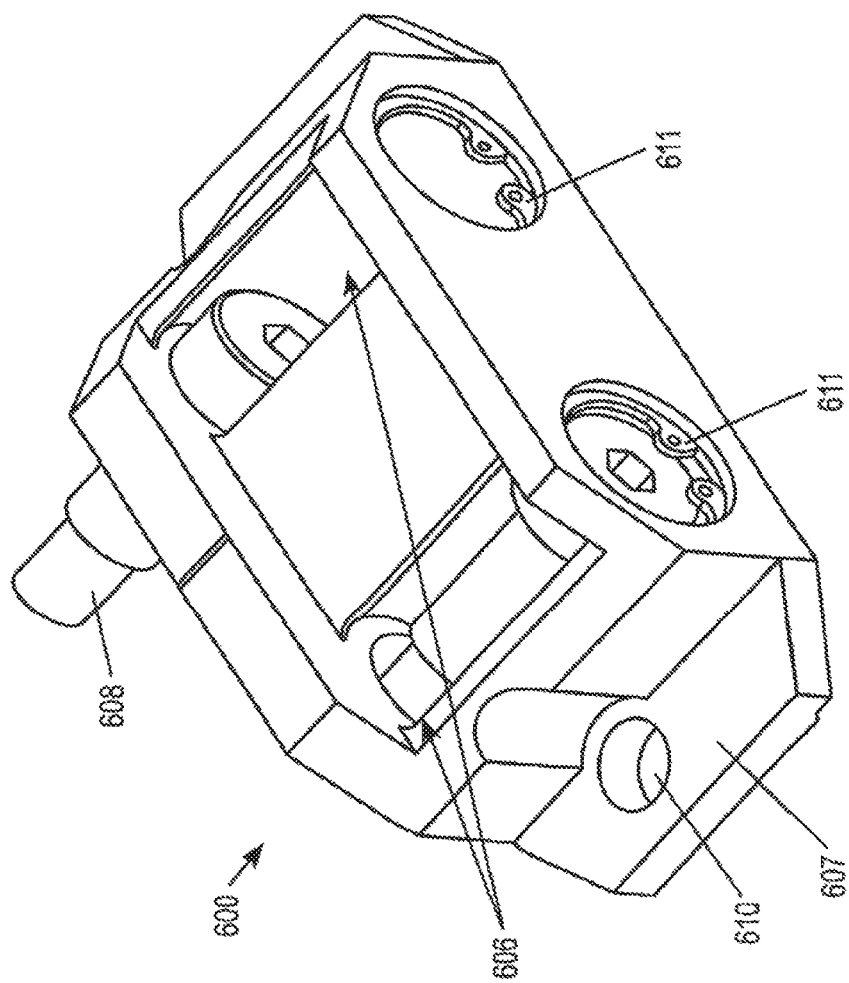

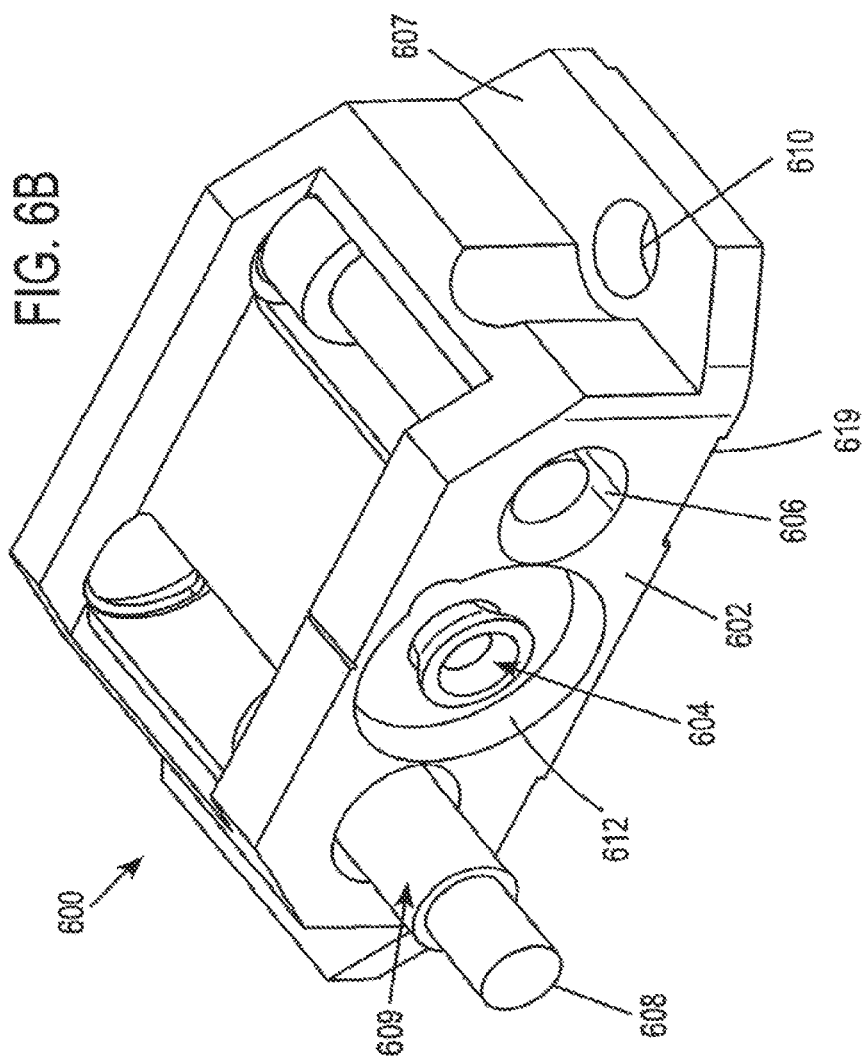

GAS DISTRIBUTION SYSTEM FOR CERAMIC SHOWERHEAD OF PLASMA ETCH REACTOR

CROSS REFERENCE TO RELATED APPLICATION

This application is a continuation of U.S. application Ser. No. 13/118,933, filed on May 31, 2011, the entire content of which is incorporated herein by reference.

BACKGROUND

The Bosch process is a plasma etch process that has been widely used to fabricate deep vertical (high aspect ratio) features (with depth such as tens to hundreds of micrometers), such as trenches and vias, in the semiconductor industry. The Bosch process comprises cycles of alternating etching steps and deposition steps. Details of the Bosch process can be found in U.S. Pat. No. 5,501,893, which is hereby incorporated by reference. The Bosch process can be carried out in a plasma processing apparatus configured with a high-density plasma source, such as an inductively coupled plasma (ICP) source, in conjunction with a radio frequency (RF) biased substrate electrode. Process gases used in the Bosch process for etching silicon can be sulfur hexafluoride ($SF_6$) in an etching step and octofluorocyclobutane ($C_4F_8$) in a deposition step. The process gas used in the etching step and the process gas used in the deposition step are respectively referred to as "etch gas" and "deposition gas" hereinbelow. During an etching step, $SF_6$ facilitates spontaneous and isotropic etching of silicon (Si); during a deposition step, $C_4F_8$ facilitates the deposition of a protective polymer layer onto sidewalls as well as bottoms of the etched structures. The Bosch process cyclically alternates between etch and deposition steps enabling deep structures to be defined into a masked silicon substrate. Upon energetic and directional ion bombardment, which is present in the etching steps, any polymer film coated in the bottoms of etched structures from the previous deposition step will be removed to expose the silicon surface for further etching. The polymer film on the sidewall will remain because it is not subjected to direct ion bombardment, thereby, inhibiting lateral etching.

One limitation of the Bosch process is roughened sidewalls of etched deep features. This limitation is due to the periodic etch/deposition scheme used in the Bosch process and is known in the art as sidewall "scalloping". For many device applications, it is desirable to minimize this sidewall roughness or scalloping. The extent of scalloping is typically measured as a scallop length and depth. The scallop length is the peak-to-peak distance of the sidewall roughness and is directly correlated to the etch depth achieved during a single etch cycle. The scallop depth is the peak to valley distance of sidewall roughness and is correlated to the degree of anisotropy of an individual etching step. The extent of scallop formation can be minimized by shortening the duration of each etch/deposition step (i.e. shorter etch/deposition steps repeated at a higher frequency).

In addition to smoother feature sidewalls it is also desirable to achieve a higher overall etch rate. The overall etch rate is defined as a total depth etched in a process divided by a total duration of the process. The overall etch rate can be increased by increasing efficiency within a process step (i.e. decreasing dead time).

FIG. 1 illustrates a conventional plasma processing apparatus 100 for processing a substrate 120 comprises a substrate support 130 and a processing chamber 140 enclosing the substrate support 130. The substrate 120 may be, for example, a semiconductor wafer having diameters such as 4", 6", 8", 12", etc. The substrate support 130 may comprise, for example, a radio frequency (RF) powered electrode. The substrate support 130 may be supported from a lower endwall of the chamber 140 or may be cantilevered, e.g., extending from a sidewall of the chamber 140. The substrate 120 may be clamped to the electrode 130 either mechanically or electrostatically. The processing chamber 140 may, for example, be a vacuum chamber.

The substrate 120 is processed in the processing chamber 140 by energizing a process gas in the processing chamber 140 into a high density plasma. A source of energy maintains a high density (e.g., $10^{11}$-$10^{12}$ ions/cm$^3$) plasma in the chamber 140. For example, an antenna 150, such as the planar multiturn spiral coil shown in FIG. 1, a non-planar multiturn coil, or an antenna having another shape, powered by a suitable RF source and suitable RF impedance matching circuitry inductively couples RF energy into the chamber to generate a high density plasma. The RF power applied to the antenna 150 can be varied according to different process gases used in the chamber 140 (e.g. etch gas containing $SF_6$ and deposition gas containing $C_4F_8$). The chamber 140 may include a suitable vacuum pumping apparatus for maintaining the interior of the chamber 140 at a desired pressure (e.g., below 5 Torr, preferably 1-100 mTorr). A dielectric window, such as the planar dielectric window 155 of uniform thickness shown in FIG. 1, or a non-planar dielectric window (not shown) is provided between the antenna 150 and the interior of the processing chamber 140 and forms a vacuum wall at the top of the processing chamber 140. A gas delivery system 110 can be used to supply process gases into the chamber 140 through a primary gas ring 170 or center injector 180 below the dielectric window 155. Details of the plasma processing apparatus 100 in FIG. 1 are disclosed in commonly-owned U.S. Patent Application Publication Nos. 2001/0010257, 2003/0070620, U.S. Pat. No. 6,013,155, or 6,270,862, each of which is incorporated herein by reference in its entirety.

Gas delivery systems designed for fast gas switching are disclosed in commonly-owned U.S. Pat. Nos. 7,459,100 and 7,708,859 and U.S. Patent Publication Nos. 2007/0158025 and 2007/0066038, the disclosures of which are hereby incorporated by reference.

The substrate 120 preferably comprises a silicon material such as a silicon wafer and/or polysilicon. Various features such as holes, vias and/or trenches are to be etched into the silicon material. A patterned masking layer (e.g. photoresist, silicon oxide, and/or silicon nitride) having an opening pattern for etching desired features is disposed on the substrate 120.

One problem of the apparatus 100 of FIG. 1 is that the primary gas ring 170 is located closer to the periphery of the substrate 120 than to the center, which increases etch rate due to the time needed for complete replacement of one process gas to another process gas over the surface of the substrate 120 and can lead to process non-uniformity due to gas pressure non-uniformity across the substrate during processing.

SUMMARY

Described herein is a gas delivery system useful for supplying process gas to a ceramic showerhead for an inductively coupled plasma processing apparatus wherein semiconductor substrates supported on a substrate support are subjected to plasma etching, the ceramic showerhead including radially extending gas inlets extending inwardly from an outer periphery thereof, the gas delivery system comprising gas connection blocks adapted to attach to the ceramic showerhead such that a gas outlet of each of the blocks is in fluid communication with a respective one of the gas inlets in the ceramic showerhead and a gas ring having equal length channels therein and gas outlets in fluid communication with downstream ends of the channels, each of the gas outlets being located on a mounting surface supporting a respective one of the gas connection blocks.

BRIEF DESCRIPTION OF FIGURES

FIGS. 3A-D show details of the lower plate 270 wherein FIG. 3A is a perspective view of an upper surface thereof, FIG. 3B is a perspective view of the lower surface thereof, FIG. 3C is a bottom view thereof, FIG. 3D is a cross sectional view thereof.

FIGS. 4 A-H show details of the upper plate 280, wherein

FIGS. 5A-B show the upper plate 280 mounted on the lower plate 270, wherein FIG. 5A is a perspective top view and FIG. 5B is a cross sectional view through the assembly shown in FIG. 5A.

FIGS. 6A-C show details of a gas connection block which supplies process gas to the ceramic showerhead wherein FIG. 6A is a perspective front view of the block, FIG. 6B is a perspective back view of the block and FIG. 6C is a bottom view thereof.

FIGS. 7A-C show details of a gas ring, wherein FIG. 7A is a top view of the gas ring, FIG. 7B is a perspective view of the gas ring and FIG. 7C shows details of the gas ring with a cover plate separated from a bottom view.

FIGS. 8A-D show details of the gas ring mounted on the ceramic showerhead, wherein FIG. 8A is a perspective view of the gas ring surrounding the showerhead, FIG. 8B shows how the shoulder screws of the gas connection block engage openings in fasteners fitted in mounting holes in the showerhead, FIG. 8C shows the shoulder screws inserted into the radially extending mounting holes in the outer periphery of the showerhead and the fasteners fully inserted in the showerhead, and FIG. 8D is a perspective cross section of a gas connection block attached to the gas ring and the showerhead.

DETAILED DESCRIPTION

The plasma processing apparatus described herein can achieve higher etch rates with greater uniformity than the conventional apparatus 100 described above.

Figure 1:
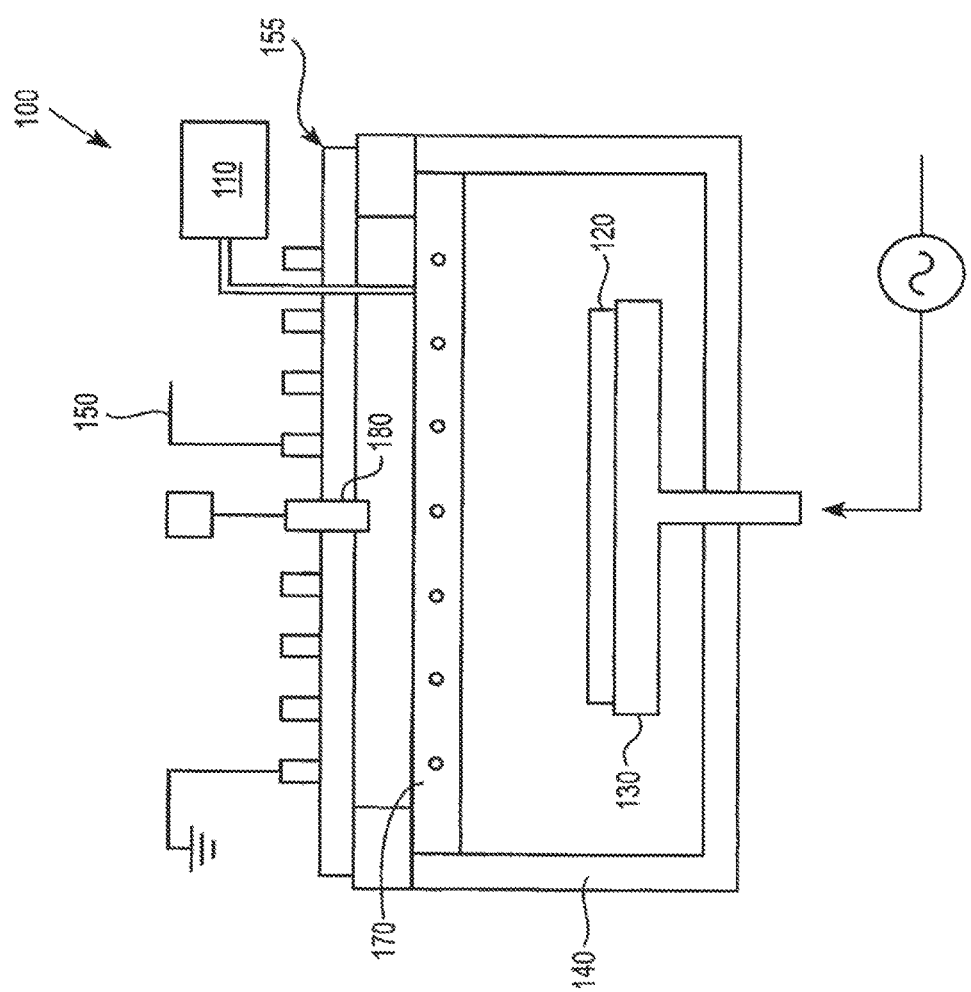
FIG. 1 shows a conventional plasma processing apparatus.
Figure 2:
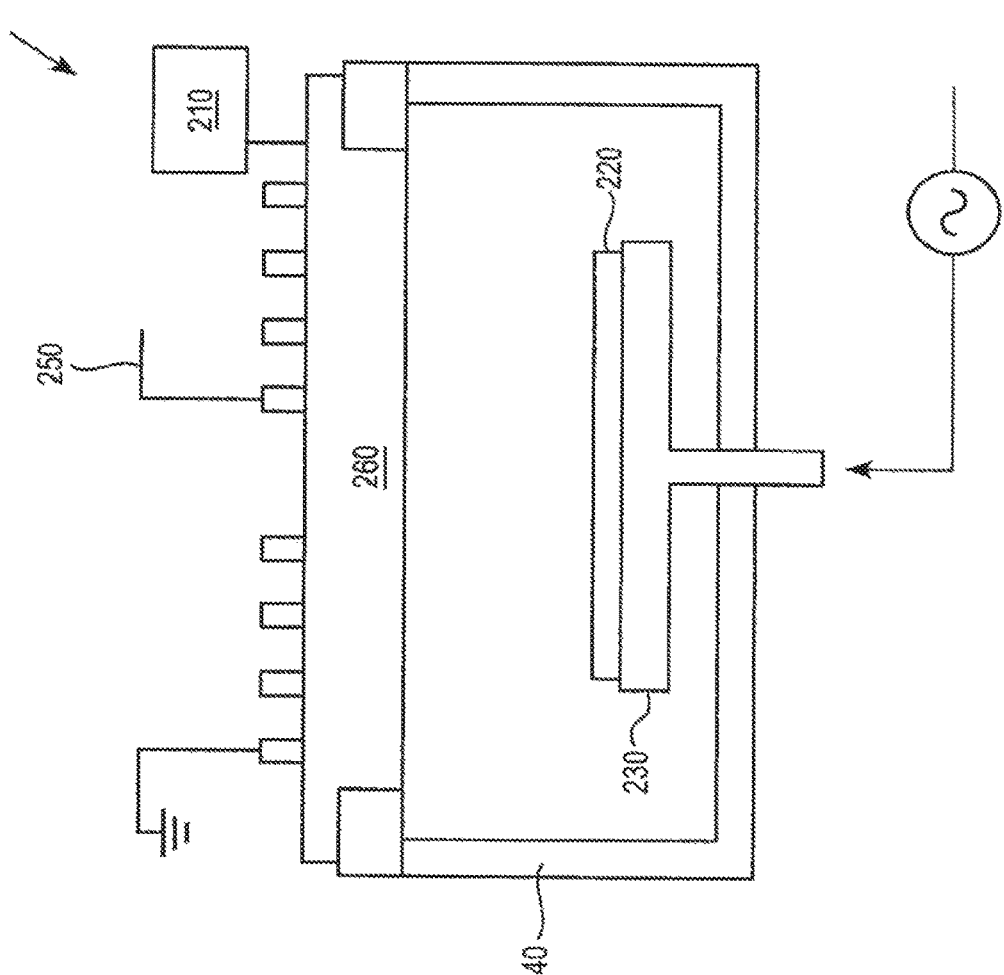
FIG. 2 shows a plasma processing apparatus according to a preferred embodiment.

According to an embodiment, as shown in FIG. 2, a plasma processing apparatus 200 for processing a substrate 220 comprises a substrate support 230 and a processing chamber 240 enclosing the substrate support 230. The substrate 220 may be, for example, a semiconductor wafer having diameters of 8 inches, 12 inches or larger. The substrate support 230 may comprise, for example, a radio frequency (RF) powered electrode. The substrate support 230 may be supported from a lower endwall of the chamber 240 or may be cantilevered, e.g., extending from a sidewall of the chamber 240. The substrate 220 may be clamped to the substrate support 230 either mechanically or electrostatically.

The substrate 220 is processed in the processing chamber 240 by energizing a process gas in the processing chamber 240 into a high density plasma. A source of energy generates and maintains a high density (e.g., $10^{11}$-$10^{12}$ ions/cm$^3$) plasma in the chamber 240. For example, an antenna 250, such as the planar multiturn spiral coil shown in FIG. 2, a non-planar multiturn coil, or an antenna having another shape, powered by a suitable RF source and suitable RF impedance matching circuitry inductively couples RF energy into the chamber to generate a high density plasma. The RF power applied to the antenna 250 can be maintained at the same power level or varied according to different process gases used in the chamber 240 (e.g. etch gas containing $SF_6$ and deposition gas containing $C_4F_8$), during cycles of alternately supplying the etch gas or disposition gas preferably within a time period of less than about 1 s, more preferably less than about 200 ms. The chamber 240 is evacuated by a suitable vacuum pumping apparatus for maintaining the interior of the chamber 240 at a desired pressure (e.g., below 5 Torr, preferably 1-500 mTorr). The pressure can be maintained at the same level or varied during the etching and deposition cycles.

The chamber includes a ceramic showerhead 260 of uniform thickness is provided between the antenna 250 and the interior of the processing chamber 240 and forms a vacuum wall at the top of the processing chamber 240. A gas delivery system 210 can be used to supply process gas into the chamber 240 through gas passages in the showerhead 260. The gas delivery system 210 alternately supplies etch gas or deposition gas into the chamber via fast switching valves (such as valve model number FSR-SD-71-6.35, available from Fujikin of America, located in Santa Clara, Calif.) which open and close within 40 milliseconds, preferably within 30 milliseconds. The valves can be on-off valves which do not direct the deposition gas to a bypass line while the etch gas is supplied to the showerhead or vice versa. Fast gas switching valves provide faster switching than MFC valves which can take 250 milliseconds to stabilize before opening or closing.

In a preferred embodiment, the showerhead is a two-piece ceramic showerhead comprising an upper plate 280 and lower plate 270 (described later with reference to FIGS. 3A-D and 4 A-H) made of an electrically insulating ceramic material, such as alumina, silicon nitride, aluminum nitride, a doped silicon carbide, quartz, etc. To prevent plasma from igniting in the showerhead gas holes, the gas holes preferably have diameters of no greater than 0.06 inch and aspect ratios of at least 2. For example, the lower plate 270 can have a thickness of at least 0.2 inch, preferably 0.2 to 1 inch. The vertical distance (chamber gap) between a bottom surface of the lower plate 270 and the substrate 220 can be varied by moving the substrate support in a vertical direction to adjust the chamber gap in which plasma is generated between the showerhead plate and the substrate.

The substrate 220 preferably comprises a silicon material such as a silicon wafer and/or polysilicon. Various features such as holes, vias and/or trenches are to be etched into the silicon material. A patterned masking layer (e.g. photoresist, silicon oxide, and/or silicon nitride) having an opening pattern for etching desired features is disposed on the substrate 220.

Compared to the conventional plasma processing apparatus 100 with side gas injection, the plasma processing apparatus 200 can more rapidly and uniformly switch the process gas in the chamber gap from the etching gas to the disposition gas and vice versa. In one embodiment wherein the substrate 220 has a diameter of 300 mm and the chamber gap is greater than 4 inches, the apparatus 200 can essentially completely switch (e.g. at least 90%) the process gas in a plenum between the upper and lower plates within about 200 milliseconds and essentially completely switch (e.g. at least 90%) the process gas in the chamber gap within about 700 milliseconds. Such rapid gas switching enables a significant increase in the etching rate of openings in silicon using the plasma processing apparatus 200 to over 10 μm/min and depending on the critical dimension (CD) of features being etched the etch rate can be higher than 20 μm/min whereas with side gas injection which provides etch rates of about 3 μm/min.

Figure 3A:
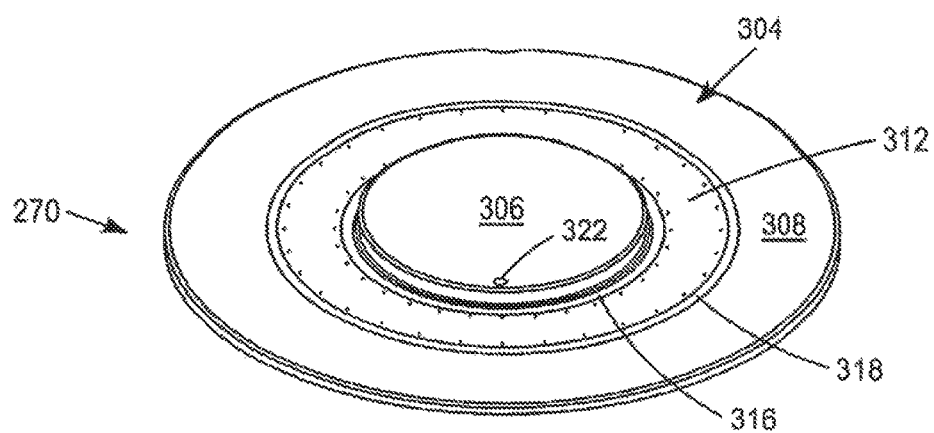
Figure 3B:
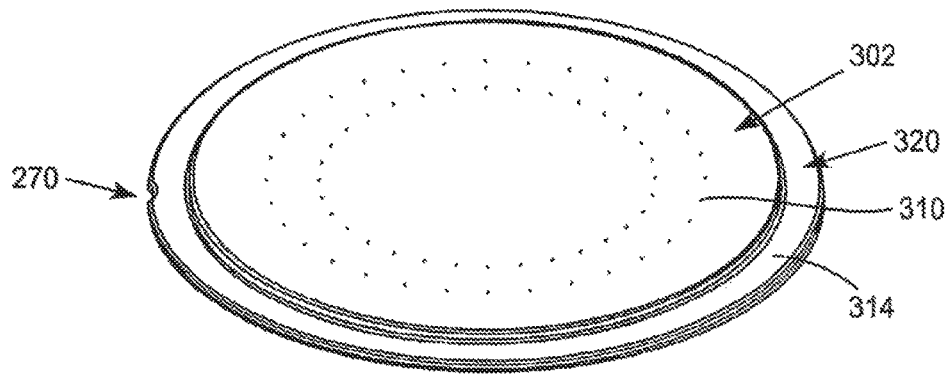
Figure 3C:
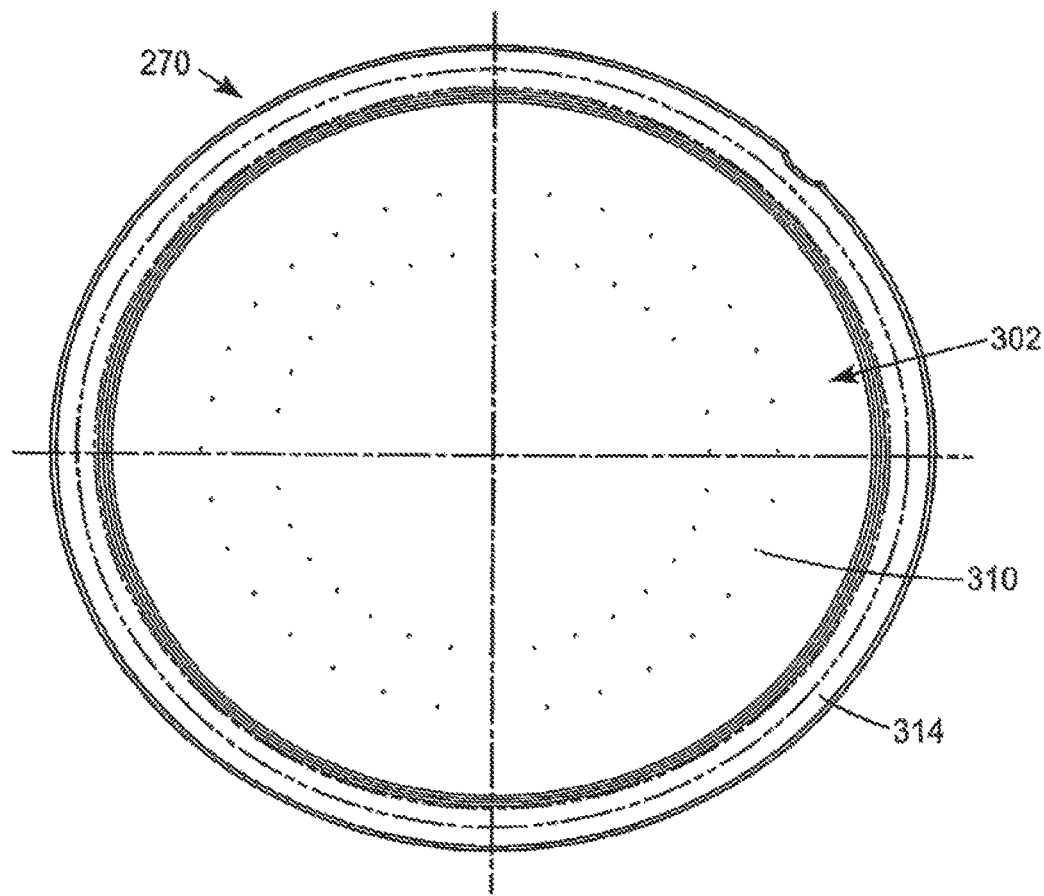
Figure 3D:
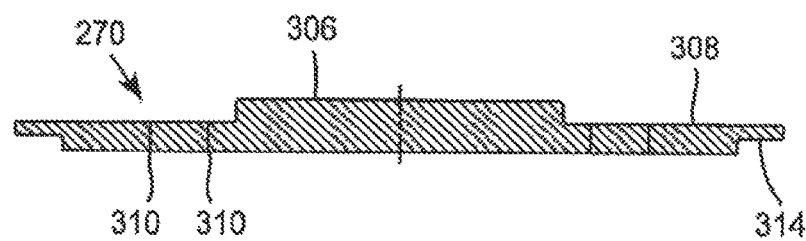

FIGS. 3A-D show details of the lower plate 270 wherein FIG. 3A is a perspective view of an upper surface thereof, FIG. 3B is a perspective view of the lower surface thereof, FIG. 3C is a bottom view thereof, and FIG. 3D is a cross sectional view thereof.

As shown in FIGS. 3A-D, the lower plate 270 includes a planar lower surface 302 and a stepped upper surface 304 which is thicker in a central portion 306 thereof and thinner in an outer portion 308 thereof, two rows of axially extending gas holes 310 located in an annular zone 312 on the outer portion 308 and extending between the upper and lower surfaces 304,302. The lower surface 302 includes a step 320 in an outer portion thereof and includes an annular vacuum sealing surface 314 which is vacuum sealed to a temperature controlled wall of the plasma chamber. The lower plate 270 includes an annular inner vacuum sealing surface 316 and an annular outer vacuum sealing surface 318 on the upper surface 304 on either side of the annular zone 312. A blind hole 322 is located on the upper surface of the central portion 306 for mounting a temperature sensor which monitors the temperature of the lower plate 270.

The thick central portion 306 efficiently dissipates heat to the ambient atmosphere above the exposed upper surface of the central portion 306. The outer edge of the showerhead can be set to an elevated temperature to offset temperature gradients across the showerhead. One or more thermal gaskets 506 can be used to promote thermal transfer between the outer portion 308 of the lower plate 270 and the overlying plate 280. The lower plate 270 is exposed to most of the heat and vacuum loads and will experience high thermal stress. By providing the complicated gas feed conduits in the upper plate 280, there is less risk of breakage due to thermal stresses during plasma processing of substrates in the chamber. Further, since the upper and lower plates are held together by vacuum force and sealed by O-rings, it is easy to periodically remove and clean these two parts. To provide erosion resistance, plasma exposed surfaces of the lower plate can be coated with yttria.

In a chamber designed to process 300 mm wafers, the lower plate 270 is wider than the wafer and the vacuum sealing surface 312 engages a mating sealing surface on the top of the chamber 240. For example, the lower plate 270 can have a diameter of about 20 inches, a thickness of about 1.5 inches at the central portion 306 and a thickness of about 0.8 inch at the outer portion 308, the gas holes 310 being arranged in two rows of gas holes including an inner row of 32 gas holes having diameters of about 0.04 inch and located about 5 inches from a center of the lower plate 270 and an outer row of 32 gas holes having diameters of about 0.04 inch and located about 6.5 inches from the center of the lower plate 270, and the sealing surface 314 located on the step 320 in the lower surface 302, the step 314 having a depth of about 0.4 inch and a width of about 1.2 inches.

Figure 4A:
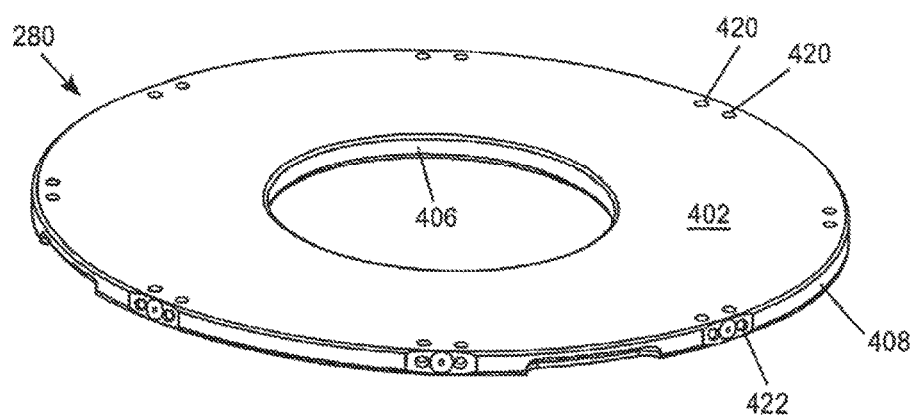
FIG. 4A is a perspective view of an upper surface thereof.
Figure 4B:
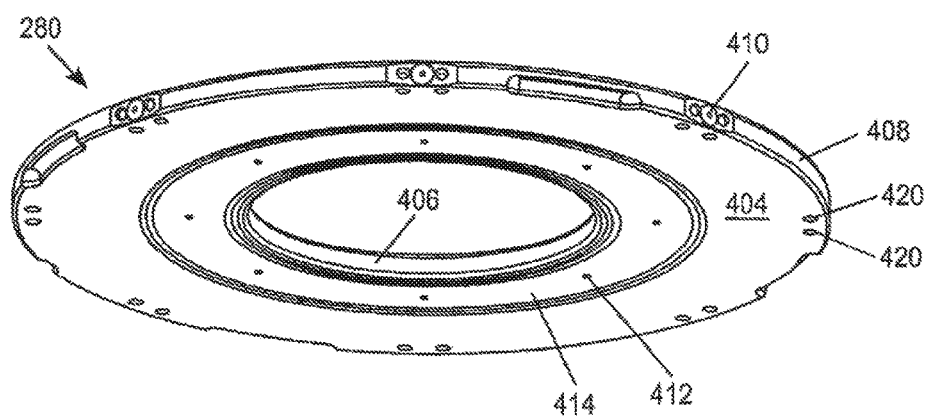
FIG. 4B is a perspective view of a lower surface thereof.
Figure 4C:
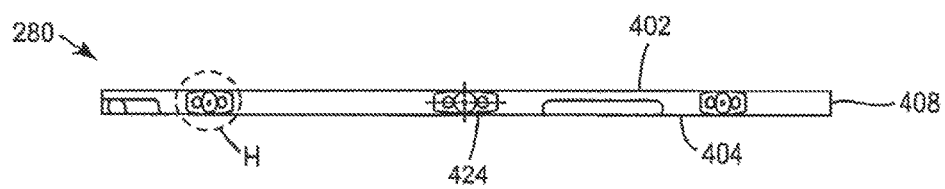
FIG. 4C is a side view thereof.
Figure 4D:
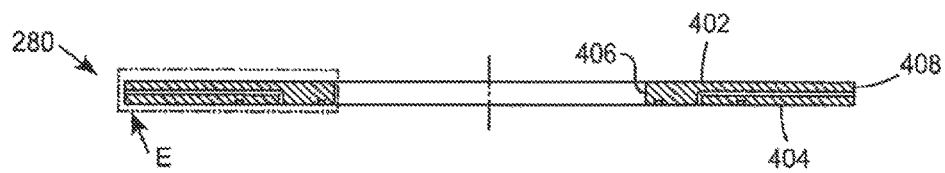
FIG. 4D is a cross sectional view thereof.
Figure 4E:
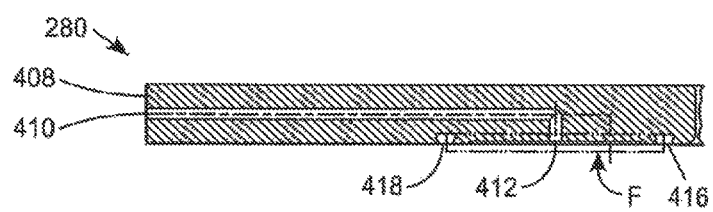
FIG. 4E is a view of Detail E in FIG. 4D.
Figure 4F:
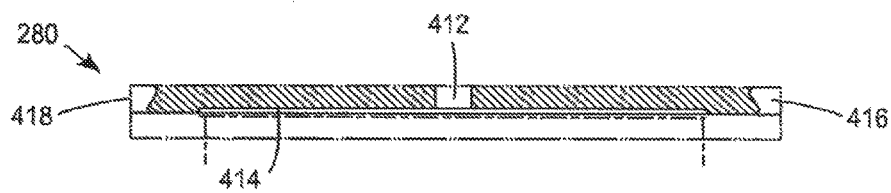
FIG. 4F is a view of Detail F in FIG. 4E.
Figure 4H:
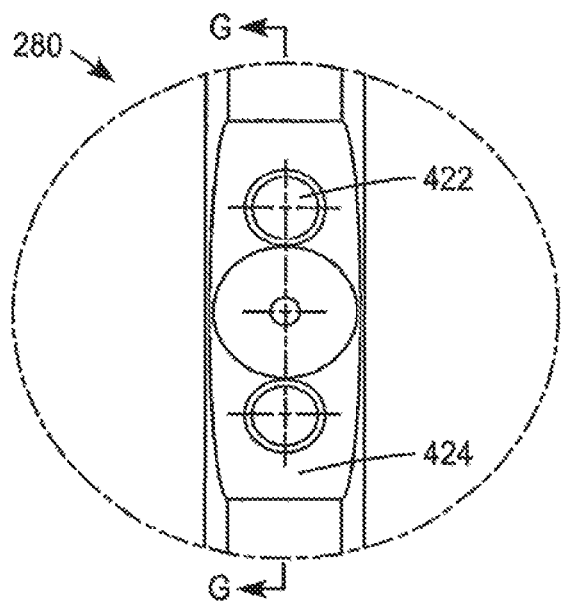
FIG. 4H is an end view of Detail H in FIG. 4C.
Figure 4G:
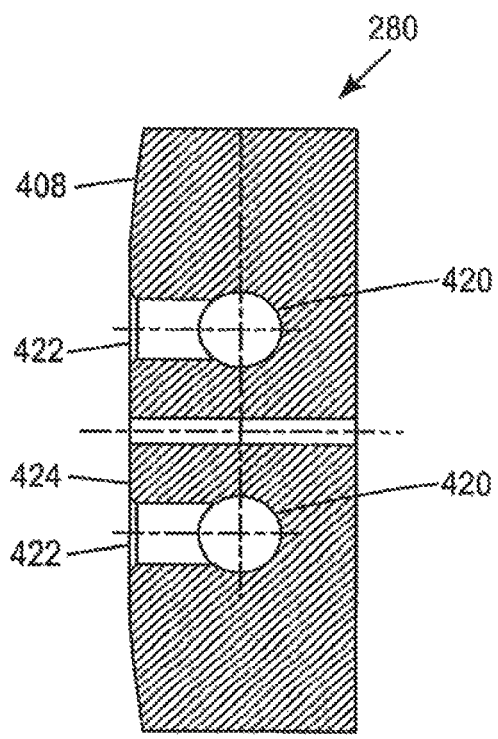
FIG. 4G is a cross sectional view at a gas connection location along the line G-G in FIG. 4H

FIGS. 4A-H show details of the upper plate 280, wherein FIG. 4A is a perspective view of an upper surface thereof, FIG. 4B is a perspective view of a lower surface thereof, FIG. 4C is a side view thereof, FIG. 4D is a cross sectional view thereof, FIG. 4E is a view of Detail E in FIG. 4D, FIG. 4F is a view of Detail F in FIG. 4E, FIG. 4G is a cross sectional view of the upper plate at a gas connection mounting surface and FIG. 4H is a side view of the mounting surface.

The upper plate 280 is an annular plate of ceramic material having a planar upper surface 402, a planar lower surface 404, an inner surface 406 and an outer surface 408. A plurality of radially extending gas passages 410 extend inwardly from the outer surface 408 and a plurality of axially extending gas passages 412 extending from the lower surface 404 to the radially extending gas passages 410. The annular upper plate 280 is configured to surround the central portion 306 of the lower plate 270 and overlie the upper surface 304 of the outer portion 308 of the lower plate 270 such that the axially extending gas passages 412 of the upper plate 280 are in fluid communication with an annular plenum 414 in fluid communication with the axially extending gas holes 310 in the lower plate 270.

For processing 300 mm wafers, the upper plate 280 is dimensioned to mate with the lower plate 270 and includes a plurality of radially extending gas passages 410 supplying the gas holes 310 in the lower plate 270. For example, the upper plate 280 can include 8 radially extending gas passages 410 having diameters of about 0.125 inch and located 45° apart, 8 axially extending gas passages 412 having diameters of about 0.125 inch and located about 5.75 inches from the center of the upper plate 270, the annular plenum 414 having a width of about 1.7 inches and depth of about 0.015 to 0.02 inch, an inner O-ring groove 416 and an outer O-ring groove 418 surrounding the annular plenum 414. Depending on process requirements, the lower plate 270 can include a different arrangement of gas holes 310 such as more or less than 64 gas holes in any desired pattern and with any desired geometry and dimensions.

To supply process gas to the gas passages 410, the upper plate 280 includes mounting holes for attaching gas connection mounting blocks. The mounting holes include 8 pairs of axially extending mounting holes 420 and 8 pairs of radially extending mounting holes 422. The holes 420 have diameters of about 0.4 inch, are located about 0.5 inch from the outer edge of the upper surface 402 of the upper plate 280 and extend through the upper plate 280 to the lower surface 404. The mounting holes 422 have diameters of about 0.35 inch, are located in flat mounting surfaces 424 on outer periphery 408 of the upper plate 280, and extend into the holes 420. The centers of each pair of the mounting holes 420, 422 are located about 1 inch apart. The upper plate 280 and lower plate 270 are preferably made of high purity alumina and the lower surface of the lower plate 270 includes a coating of high purity yttria covering all of the lower surface except the sealing vacuum surface 314.

Figure 5A:
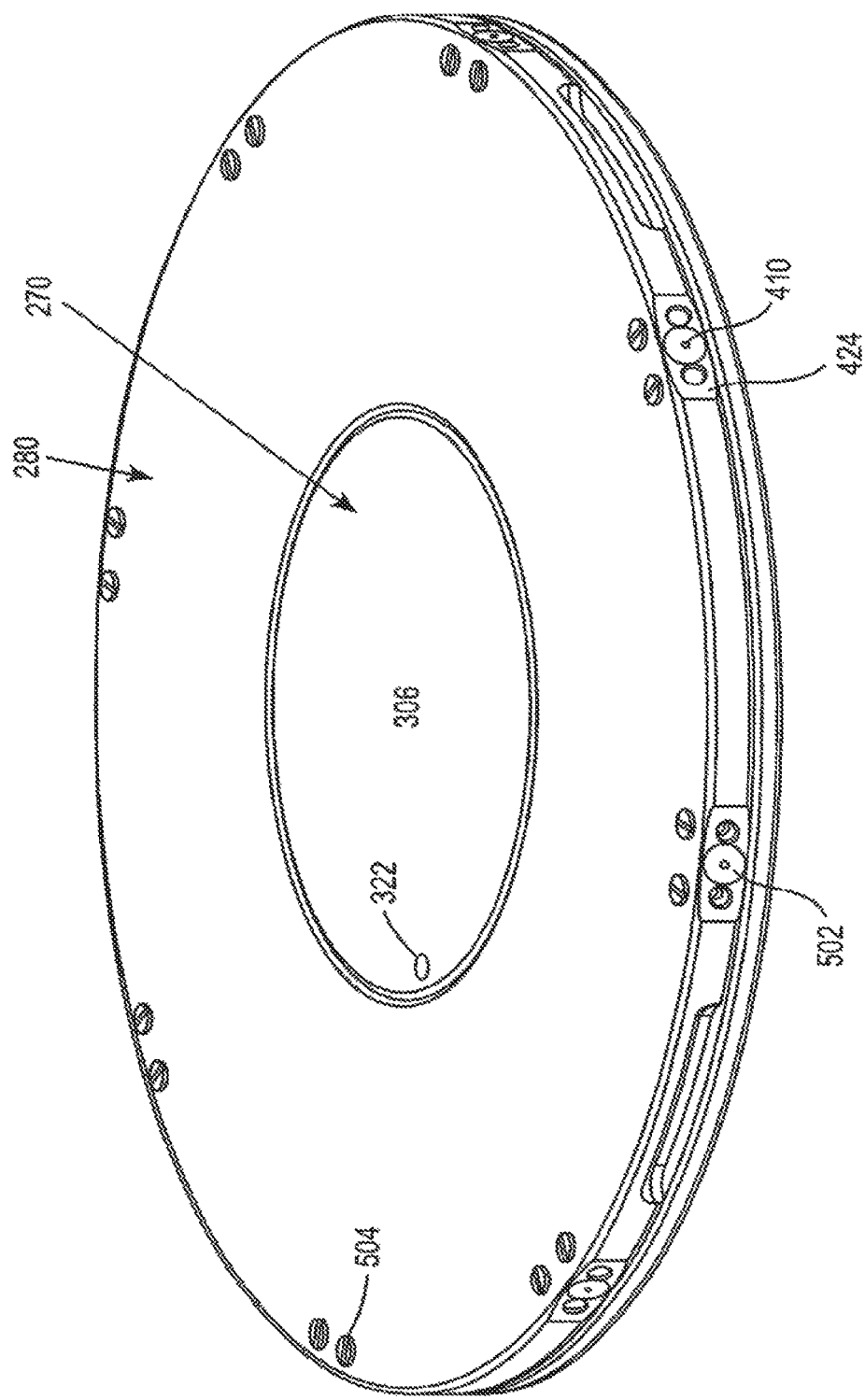

FIGS. 5A-B show the upper plate 280 mounted on the lower plate 270, wherein FIG. 5A is a perspective top view and FIG. 5B is a cross sectional view through the assembly shown in FIG. 5A. The mounting holes 420 on the upper plate receive fasteners 504 which permit attachment of eight gas connection blocks (not shown) to the outer surface 408 of the upper plate 280. The gas blocks deliver process gas to eight gas connection locations 502 at which the process gas flows into the eight radially extending gas passages 410. By feeding the process gas from the outer surface 408 at equally spaced locations, fast gas switching can be achieved in the chamber. The gas volume of the annular plenum 414 between the upper and lower plates is preferably less than 500 cm$^3$ which allows fast changeover from etch to deposition gases. The thick central portion 306 of the lower plate 270 allows heat dissipation and thermally conductive gaskets 506 between the opposed surfaces of the upper and lower plates allow the outer portion 308 of the lower plate 270 to be maintained at a desired temperature. The lower plate 270 is exposed to most of the heat and vacuum loads and will experience high thermal stress. Thus, it is desirable to minimize features on the lower plate which might induce thermal fracture. With the two piece design, the complicated machined features that might induce thermal fracture are located on the upper plate 280. The upper and lower plates are not bolted together but rather are held together only by vacuum force and vacuum sealed with two O-ring seals located in the O-ring grooves 416,418. This mounting arrangement allows easy disassembly for cleaning of the upper and lower plates.

With the plasma processing apparatus 200 described above, the gas delivery system is operable to alternately supply an etching gas and a deposition gas to the plenum and replace the etching gas in the plenum between the upper and lower plates with the deposition gas within 200 milliseconds or replace the deposition gas in the plenum with the etching gas within 200 milliseconds. The plasma processing apparatus can be used to etch silicon on a semiconductor substrate supported on a substrate support at a rate of at least 10 μm/min. The plasma processing apparatus is operable to essentially completely switch process gas in the plenum within 200 milliseconds and in a plasma confinement zone (chamber gap) in the processing chamber from the etching gas to the deposition gas or vice versa within about 500 ms.

In the preferred embodiment, the etching gas is SF$_6$ and the deposition gas is C$_4$F$_8$. In operation, the gas supply system does not divert the etching gas to a vacuum line during supply of the deposition gas to the plenum and does not divert the deposition gas to a vacuum line during supply of the etching gas to the plenum. Processing of a substrate using the plasma processing apparatus described above preferably comprises (a) supporting the substrate in the chamber, (b) supplying the etching gas to the plenum and flowing the etching gas through the gas holes in the lower plate into the chamber gap, (c) energizing the etching gas in the chamber into a first plasma and processing the substrate with the first plasma, (d) supplying the deposition gas to the plenum so as to substantially replace the etching gas and flowing the deposition gas through the gas holes in the lower plate into the chamber gap, (e) energizing the deposition gas in the chamber into a second plasma and processing the substrate with the second plasma, (f) repeating steps (b)-(e) with a total cycle time of no greater than 1.8 seconds.

The etching gas preferably replaces at least 90% of the deposition gas in the chamber gap within a period of about 500 milliseconds in step (b), and the deposition gas preferably replaces at least 90% of the etching gas in the chamber gap within a period of about 500 milliseconds in step (d). During the process, pressure in the plenum is at least 5 Torr during steps (b)-(e). During a cycle of supplying the etching gas and deposition gas, a total time of supplying the etching gas can be 1.3 seconds or less and a total time of supplying the deposition gas can be 0.7 seconds or less.

Chamber pressure can be adjusted such that pressure in the chamber gap during supply of the etching gas is greater than 150 mTorr and pressure in the chamber gap during supply of the deposition gas is less than 150 mTorr. In a preferred process, the etching gas is supplied to the plenum at a flow rate of at least 500 sccm and the deposition gas is supplied to the plenum at a flow rate of less than 500 sccm. Preferably, the chamber gap between the substrate and the lower plate is greater than 4 inches. During the supply of the etching gas the substrate can be subjected to plasma etching of high aspect ratio openings with pressure in the chamber gap maintained at less than 150 mTorr for 200 milliseconds during a polymer clearing phase of the etching step and at over 150 mTorr for the remainder of the plasma etching step. During the supply of the deposition gas the second plasma can deposit a polymer coating on sidewalls of the openings with pressure in the chamber gap maintained at less than 150 mTorr for the entire deposition step. The etching gas can be one or more of SF$_6$, CF$_4$, XeF$_2$, NF$_3$, Cl containing gas such as CCl$_4$ and the deposition gas can be one or more of C$_4$F$_8$, C$_4$F$_6$, CHF$_3$, CH$_2$F$_2$, CH$_4$, C$_3$F$_6$, CH$_3$F.

The etching gas can be supplied through a first valve to eight etch gas lines which deliver the etching gas to the gas inlets in the outer periphery of the upper plate wherein the eight etch gas lines have equal conductance. Likewise, the deposition gas is supplied through a second valve to eight deposition gas lines which deliver the deposition gas to the gas inlets wherein the eight deposition gas lines have equal conductance. Fast acting valves can be used wherein fast acting solenoid valves upon receiving a signal from a controller send pneumatic air to a fast switching valve within 10 milliseconds and total time to open or close the fast switching valve can be 30 milliseconds or less.

Figure 6C:
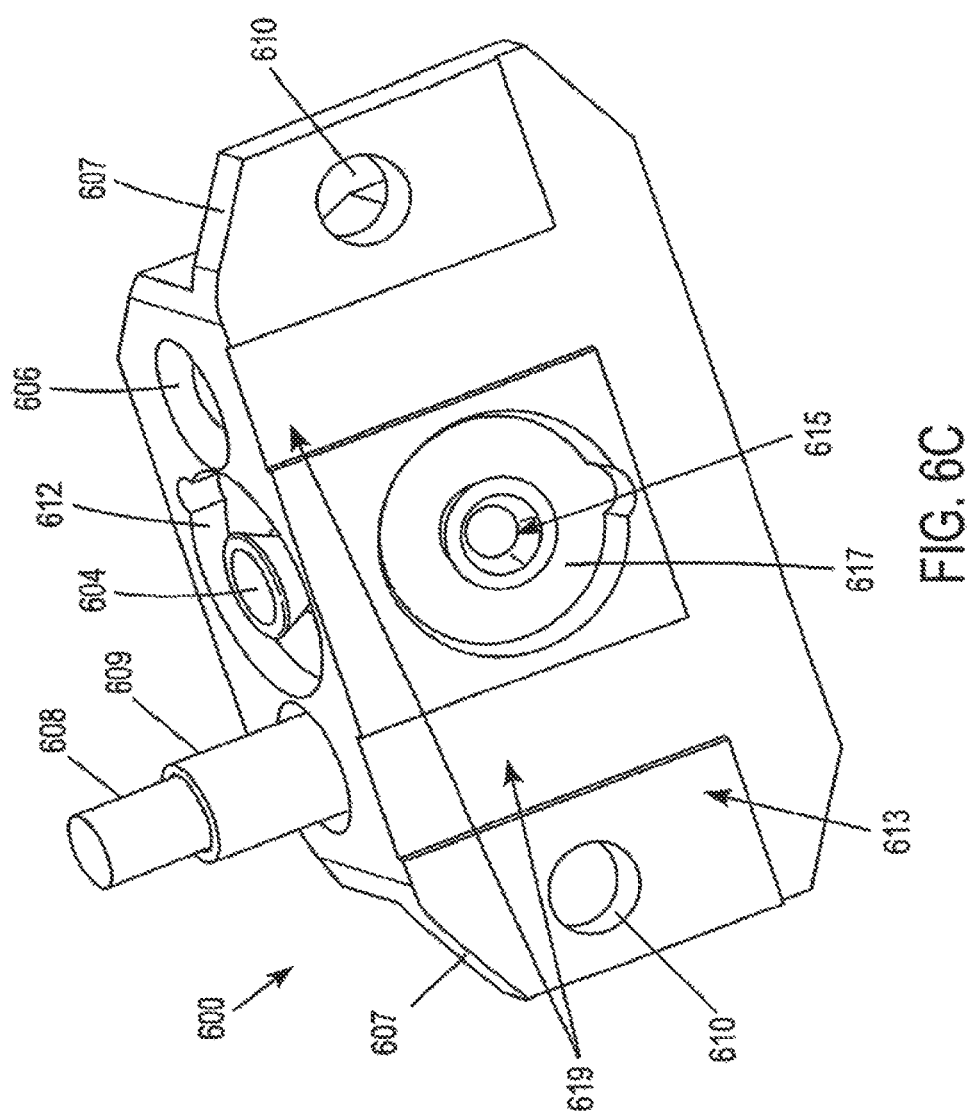

FIGS. 6A-C show an exemplary gas connection block 600 made of corrosion resistant metallic material such as stainless steel or polymer material for supplying process gas to one of the radially extending gas passage 410 in the upper plate 280. FIG. 6A is a perspective front view, FIG. 6B is a perspective rear view and FIG. 6C is a bottom view of the connection block 600. The connection block 600 includes a mounting surface 602 which contacts the flat mounting surface 424 such that a gas outlet 604 in the mounting surface 602 aligns with the gas passage 410. A pair of bores 606 are aligned with holes 422 in the flat face 424 and a pair of shoulder screws 608 are slidable in the bores 606 in a direction away from the surface 602 such that press fitted plastic sleeves 609 on the shoulder screws 608 enter the holes 422 to position the block 600 on the upper plate 280. Circlips 611 at opposite ends of the bores 606 prevent the shoulder screws from falling out of the bores 606. An O-ring groove 612 in the surface 602 around the gas outlet 604 receives a gasket such as an O-ring to provide a seal between the block 600 and the flat mounting surface 424 on the upper plate 280. A pair of mounting holes 610 extend through flanges 607 to mount the block 600 on a gas delivery ring. The block 600 includes a mounting surface 613 with a gas inlet 615 therethrough and an O-ring groove 617 around the inlet 615. Shallow rectangular recesses 619 reduce thermal transfer between the block 600 and the gas delivery ring.

Figure 7A:
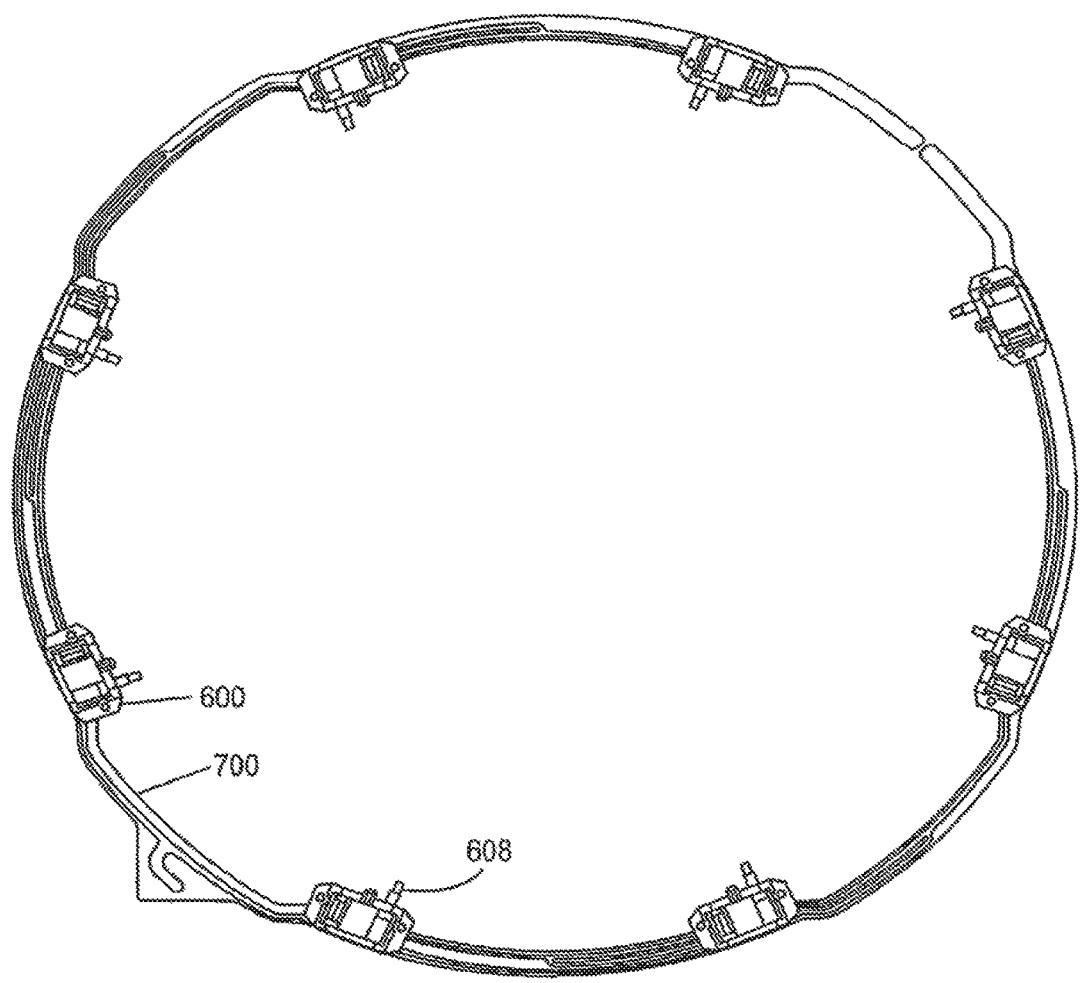
Figure 7B:
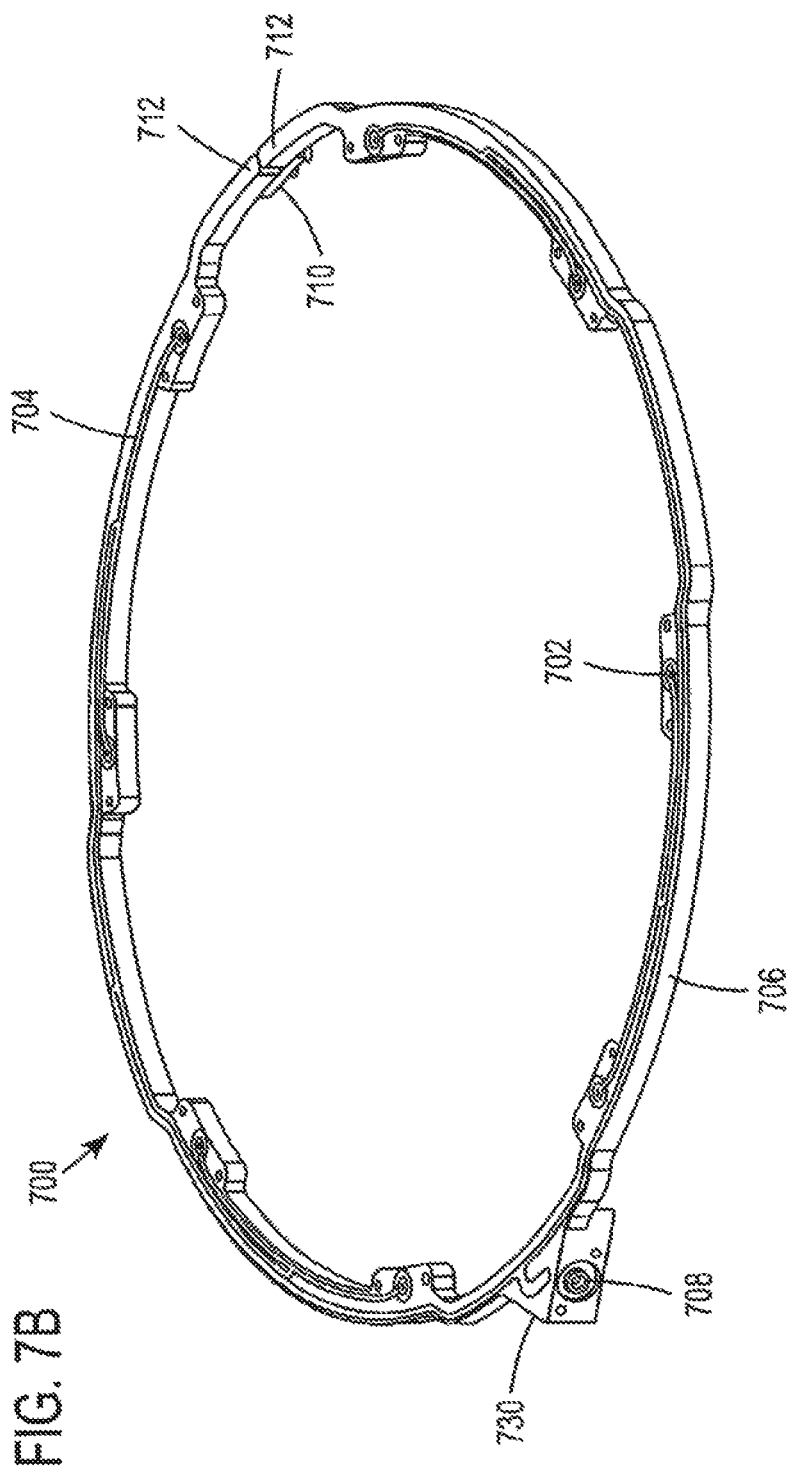
Figure 7C:
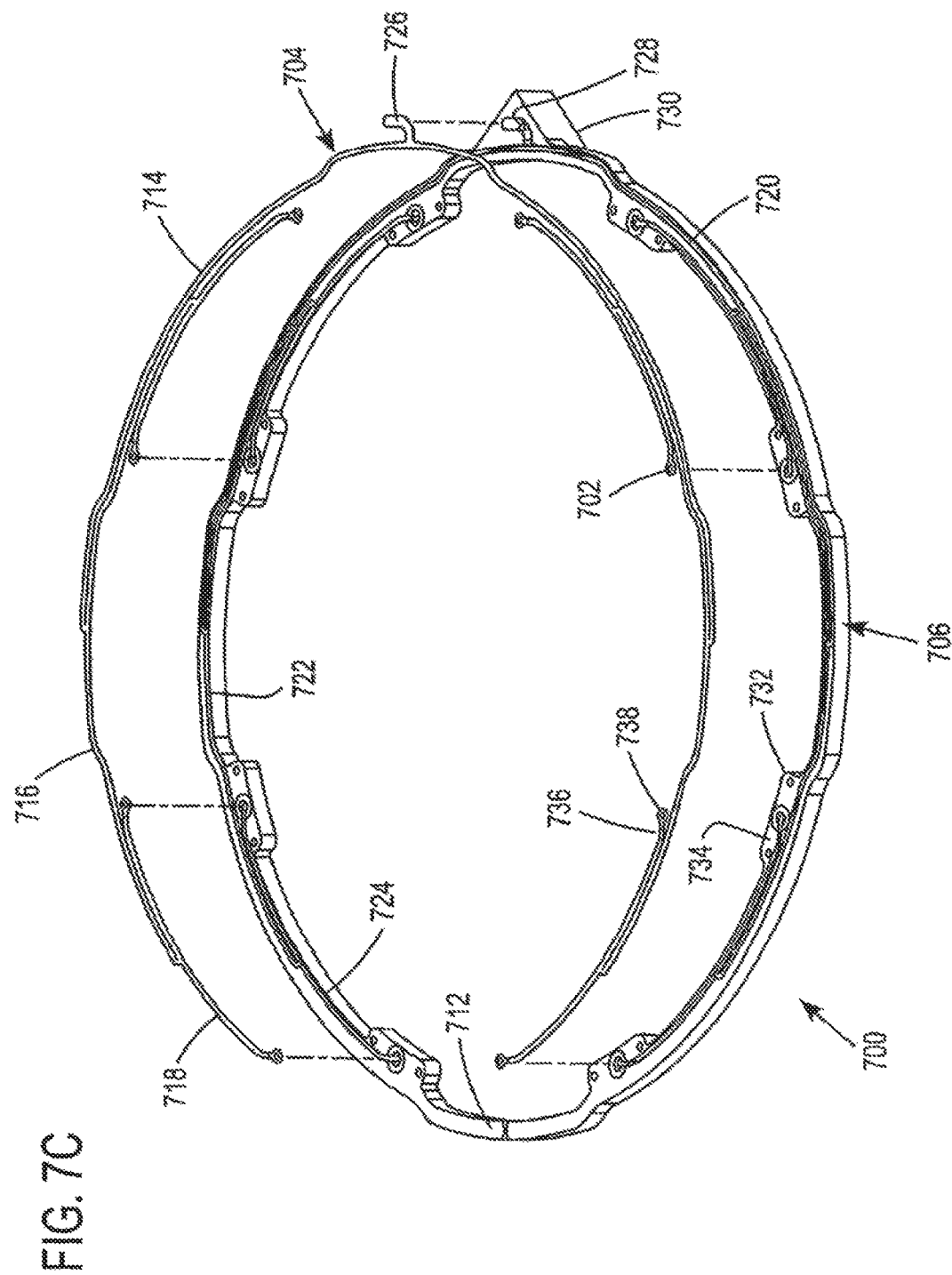

FIGS. 7A-C show details of a gas delivery ring 700. FIG. 7A shows the ring 700 with the eight gas connection blocks 600 mounted thereon, each block 600 providing fluid communication between the interior of the block and the gas inlet 410 in the upper plate 280. FIG. 7B shows details of the gas ring 700 without the blocks 600 mounted thereon. The gas ring 700 includes eight gas outlets 702 in an upper cover plate 704, a bottom ring 706 having channels therein enclosed by the upper cover 704, a gas inlet 708 through which process gas enters the ring 700, and an extension limiter 710 connecting ends 712 of the bottom ring opposite the gas inlet 708. As shown in FIG. 7C, the cover plate 704 includes interconnected sections wherein a first section 714 extends ½ the diameter of the ring 706, a pair of second sections 716 each attached at its midpoint to a respective end of the first section 714 and extending ¼ the diameter of the ring 706 and four third sections 718 each attached at its midpoint to a respective end of one of the second sections 716 to position the eight gas outlets 702 equal distances apart. The bottom ring 706 includes interconnected channels therein wherein a first channel 720 extends ½ the diameter of the ring 706, a pair of second channels 722 each connected at its midpoint to a respective end of the first channel 720 and extending ¼ the diameter of the ring 706 and four third channels 724 each connected at its midpoint to a respective end of one of the second channels 722. The cover plate 704 includes an L-shaped section 726 attached to the middle of the first section 714. The L-shaped section covers an L-shaped channel 728 in a gas inlet section 730 of the lower ring 706, the channel 728 connecting the gas inlet 708 to the first channel 720. The bottom ring 706 includes mounting holes 732 in mounting surfaces 734, the holes 732 aligning with the holes 610 in a respective one of the eight gas connection blocks 600.

The cover plate 704 and bottom ring 706 are preferably made from a corrosion resistant metallic material such as stainless steel or polymer material and the cover plate 704 can be sealed to the lower ring 706 by a suitable manufacturing process such as electron beam welding. The inner and/or outer surfaces of the cover plate and/or bottom ring can be coated with a protective material such as a silicon coating. A preferred silicon coating is "SILCOLLOY 1000", a chemically vapor deposited (CVD) multilayer silicon coating available from SilcoTek, located in Bellefonte, Pa. Details of suitable CVD silicon coatings can be found in U.S. Pat. No. 7,070,833, the disclosure of which is hereby incorporated by reference. Although dimensions can vary depending on the size of the showerhead and gas inlet arrangement, in a preferred embodiment the channels 720/722/724 in the bottom ring 706 can be about 0.1 inch wide and about 0.32 inch high, the gas outlets 702 can be located on a radius of about 10.4 inches. The cover plate 704 can be slightly wider than the channels in the bottom ring and fit within a recess at the top of each channel. For example, the first, second and third sections 714/716/718 can have a thickness of about 0.03 inch and a width of about 0.12 inch. As shown in FIG. 7C, ends 736 of the third sections 718 of the cover ring 704 can be angled inwardly and include rounded ends 738. The rounded ends 738 can have a diameter of about 0.32 inch and openings forming the gas outlets 702 can have a diameter of about 0.19 inch centered in the rounded ends 734.

To avoid sudden changes in direction between the channels 720/722/724, the two connections between the ends of the first channel 720 and the middle of the second channels 722 are preferably rounded with a radius of about 0.13 inch and the four connections between the ends of the second channels 722 and the middle of the third channels 724 are rounded with a radius of about 0.13 inch. In some portions of the bottom ring there is a single channel (such as portions of the first channel 720 and portions of the third channels 724), two adjacent channels (such as portions where the first and third channels are concentric, the first and second channels are concentric or the second and third channels are concentric), or three adjacent channels (where the first, second and third channels are concentric).

The gas ring 700 is preferably circular but other configurations are possible if the ceramic showerhead has a different shape. To attach the gas ring 700 to the showerhead, the extension limiter 710 is loosened and the gas ring is positioned around the upper plate 280. After the shoulder screws 608 are engaged with the holes 422 and the gas passages 616 sealed in fluid communication with the gas inlets 410, the extension limiter 710 is fastened such that the ends 712 of the gas ring 700 are concentrically aligned.

Figure 8A:
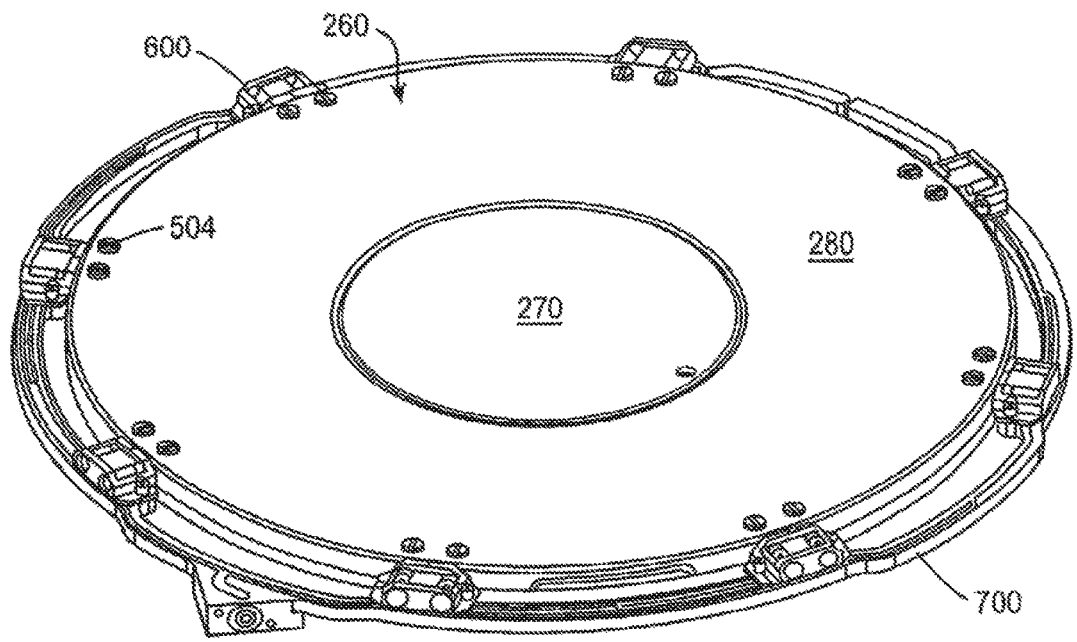
Figure 8D:
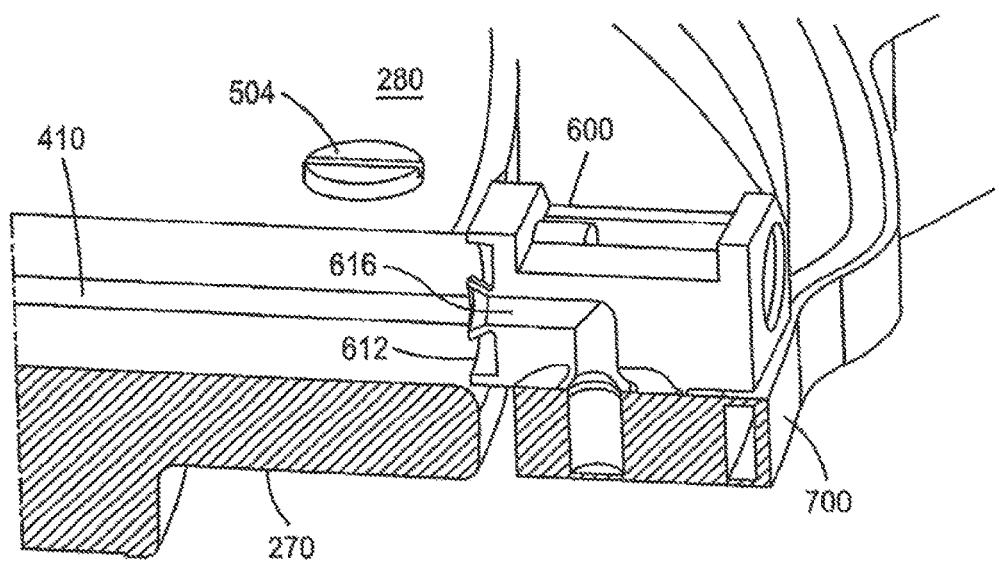
Figure 8B:
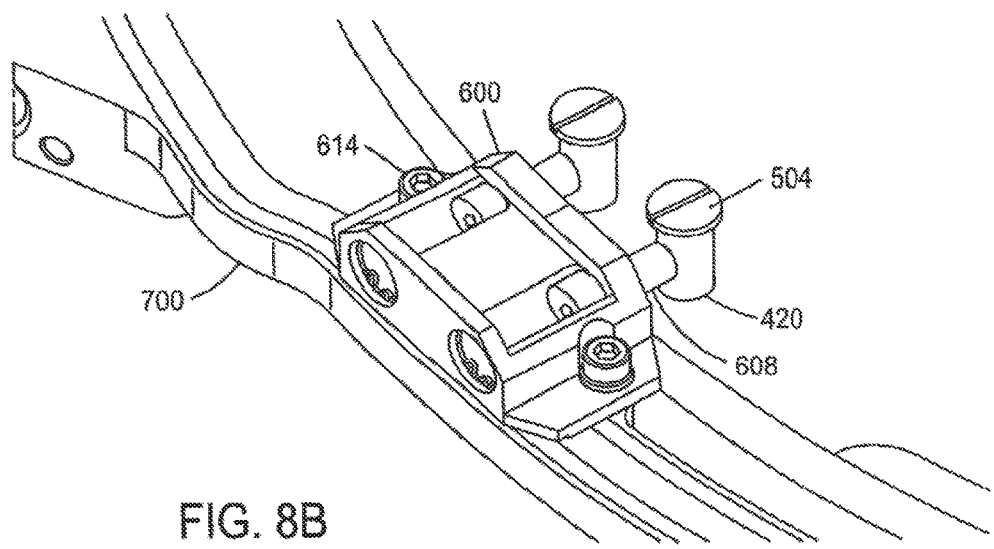
Figure 8C:
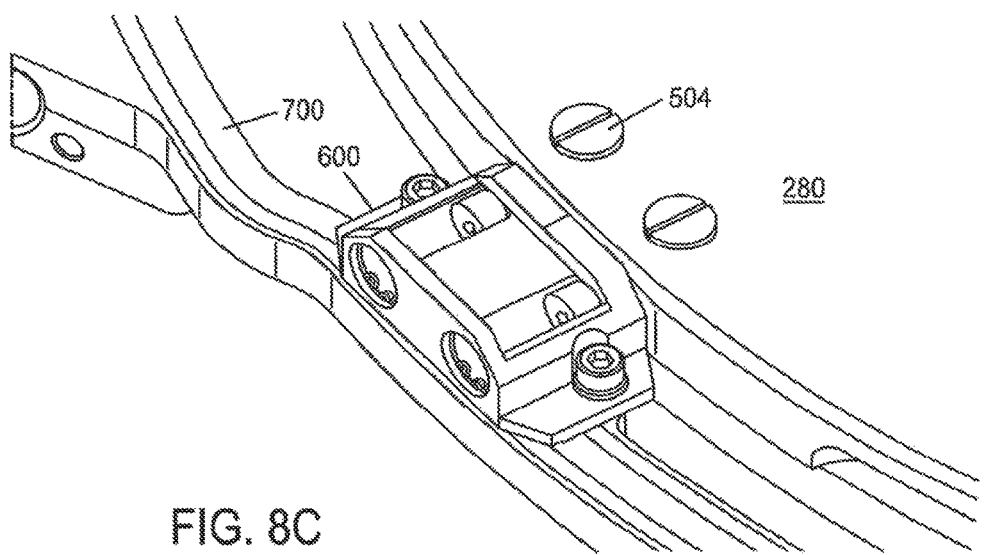

FIG. 8A is a perspective view of the gas ring 700 attached to the upper plate 280 of the showerhead 260 via the gas connection blocks 600. FIG. 8B illustrates how the shoulder screws 608, which slide in bores 606 in the gas connection blocks 600, fit in horizontal openings in fasteners 504 which extend into mounting holes 420 in the upper plate 280. As shown in FIG. 8C, the shoulder screws 608 include plastic bushings 609 to minimize abrasion with the horizontal holes 422 in the ceramic upper plate 280. When the shoulder screws 608 are inserted into the holes 422 in the flat mounting surface 424 on the outer periphery of the upper plate 280, ends of the shoulder screws 608 enter the openings in the fasteners 504 to hold the block 600 in position. Screws 614 mounted in holes 610 fasten the gas connection blocks 600 to the gas ring 700. As shown in FIG. 8D, each gas connection block 600 includes an L-shaped passage 616 connecting the outlet 702 of the gas ring 700 to an inlet of one of the radially extending gas passages 410 in the upper plate 280. An O-ring in the O-ring groove 612 surrounds the outlet 604 of the L-shaped passage 616 to provide a seal between the gas connection block 600 and the flat mounting surface 424 on the upper plate 280. Likewise, an O-ring in O-ring groove 617 provides a seal between the gas connection block 600 and the mounting surface 734 on the gas ring 700.

Assembly of the gas ring 700 to the upper plate 280 requires the gas connection blocks 600 to be attached to the gas ring 700 using the screws 614, the gas ring 700 is spread open and slid over the upper plate 280, the fasteners 504 are fully inserted into the vertical holes 420 with the openings in the fasteners 504 aligned with the openings 422, the gas ring is closed around the upper plate 280 and the plate 710 is tightened to prevent the ring from opening, and the screws 608 are inserted into the holes 422 and through the openings in the fasteners 504. The fasteners 504 are preferably made of plastic and hold the blocks 600 in position around the showerhead.

With the gas ring 700, the process gas can be supplied through a single inlet and delivered along equal length flow paths to the outlets 702 whereby the pressure or flow rate of the gas ejected from each of the outlets 702 are the same and the gas is uniformly ejected from each outlet. Thus, the flow passage resistance (conductance) from each of the outlets can be made equal. As mentioned above, the number of outlets and channels can be adapted to as needed and need not be restricted to eight outlets or the particular channel arrangement described above.

In this specification, the word "about" is often used in connection with a numerical value to indicate that mathematical precision of such value is not intended. Accordingly, it is intended that where "about" is used with a numerical value, a tolerance of 10% is contemplated for that numerical value.

While the plasma processing apparatus operable to quickly switch process gas has been described in detail with reference to specific embodiments thereof, it will be apparent to those skilled in the art that various changes and modifications can be made, and equivalents employed, without departing from the scope of the appended claims.

We claim:

1. A gas delivery ring configured to supply process gas to an outer periphery of a showerhead of a plasma processing apparatus wherein a semiconductor substrate supported on a substrate support is subjected to plasma processing, the gas delivery ring comprising:

a gas ring having a single gas inlet, a plurality of channels, and a plurality of gas outlets in fluid communication with the gas inlet via the channels;

the channels including a first channel connected to the gas inlet at a midpoint thereof with downstream ends of the first channel equidistant from the gas inlet and from each other, two second channels connected at midpoints thereof to the downstream ends of the first channel with downstream ends of the second channels equidistant from the downstream ends of the first channel and from each other, and four third channels connected at midpoints thereof to downstream ends of the second channels with downstream ends of the third channels connected to the gas outlets; and a bottom ring and cover ring, the channels extending into an upper surface of the bottom ring and enclosed by the cover ring, wherein an upper surface of the gas delivery ring includes mounting surfaces having mounting holes therein configured to receive fasteners of gas connection blocks which attach the gas delivery ring to the outer periphery of the showerhead, and wherein the channels are disposed within the same plane.

2. The gas delivery ring of claim 1, wherein the gas delivery ring includes free ends equidistant from the midpoint of the first channel.

3. The gas delivery ring of claim 2, wherein an extension limiter connects the free ends of the gas delivery ring.

4. The gas delivery ring of claim 1, wherein the gas outlets are in an upper surface of the cover ring.

5. The gas delivery ring of claim 1, wherein surfaces of the channels are coated with a silicon coating.

6. The gas delivery ring of claim 1, wherein the channels are rounded at locations where the ends of the first channel are connected to midpoints of the second channels and where the ends of the second channels are connected to the third channels, and downstream ends of the third channels are angled inwardly and include rounded ends.

7. The gas delivery ring of claim 1, wherein the gas inlet is on an outer periphery of the gas delivery ring and an L-shaped channel extends between the gas inlet and the midpoint of the first channel.

8. The gas delivery ring of claim 1, wherein the cover ring is welded to the bottom ring, the gas outlets are located on a radius of about 10 to 11 inches from a center of the gas delivery ring, the channels are rectangular in cross section with a width of about 0.1 inch and height of about 0.32 inch, the cover ring has a thickness of about 0.03 inch and is located in a recess in an upper surface of the bottom ring, the recess having a width of about 0.12 inch along opposite sides of the channels.

* * * * *